United States Patent
Kao et al.

(10) Patent No.: US 11,515,459 B2
(45) Date of Patent: Nov. 29, 2022

(54) MICRO LIGHT-EMITTING DIODE DISPLAY PANEL AND METHOD FOR PRODUCING THE SAME

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Ping-Hsiang Kao, Guangdong (CN); Po-Lun Chen, Guangdong (CN); Chun-Ta Chen, Guangdong (CN); Po-Ching Lin, Guangdong (CN); Ya-Chu Hsu, Guangdong (CN); Chia-Ming Fan, Guangdong (CN); Chien-Yu Huang, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

(*) Notice: Subject to any disclaimer, the term of this patent is extended or adjusted under 35 U.S.C. 154(b) by 47 days.

(21) Appl. No.: 17/158,020

(22) Filed: Jan. 26, 2021

(65) Prior Publication Data
US 2022/0199872 A1 Jun. 23, 2022

(30) Foreign Application Priority Data

Dec. 22, 2020 (CN) .......................... 202011531349.X

(51) Int. Cl.
*H01L 33/62* (2010.01)
*H01L 33/00* (2010.01)
(Continued)

(52) U.S. Cl.
CPC ............ *H01L 33/62* (2013.01); *H01L 27/156* (2013.01); *H01L 33/0093* (2020.05);
(Continued)

(58) Field of Classification Search
None
See application file for complete search history.

(56) References Cited

U.S. PATENT DOCUMENTS

| | | | |
|---|---|---|---|
| 2016/0204313 A1* | 7/2016 | Namiki | H01L 24/16 252/514 |
| 2020/0313035 A1* | 10/2020 | Lee | H01L 24/97 |
| 2021/0064091 A1* | 3/2021 | Wang | G06F 1/1609 |

FOREIGN PATENT DOCUMENTS

CN 111048499 A * 4/2020 ............. H01L 24/29

* cited by examiner

*Primary Examiner* — Robert K Carpenter
(74) *Attorney, Agent, or Firm* — CKC & Partners Co., LLC

(57) ABSTRACT

The present invention relates to a micro light-emitting diode display panel and a method for producing the same. A backplane and a light-emitting diode display layer are subjected to a bonding process to form eutectic structures between the backplane and light-emitting diodes of the light-emitting diode display layer. Then, an adhesive bonding layer including a resin material and conducting materials is formed on a surface of the backplane, and a heating process is performed, thereby causing the conducting materials to form a plurality of metallic bridge connection structures. Therefore, a bonding between the light-emitting diode and the backplane is reinforced, and tensile strength of the micro light-emitting diode display panel is enhanced.

9 Claims, 10 Drawing Sheets

(51) Int. Cl.
*H01L 27/15* (2006.01)
*H01L 33/56* (2010.01)
(52) U.S. Cl.
CPC .......... *H01L 33/0095* (2013.01); *H01L 33/56* (2013.01); *H01L 2933/0066* (2013.01)

MICRO LIGHT-EMITTING DIODE DISPLAY PANEL AND METHOD FOR PRODUCING THE SAME

RELATED APPLICATIONS

This application claims priority to China application No. 202011531349.X, filed on Dec. 22, 2020, which is herein incorporated by reference in its entirety.

BACKGROUND

Field of Invention

The present invention relates to a display panel. More particularly, a micro light-emitting diode display panel and a method for producing the same are provided.

Description of Related Art

With a tendency of improved technology and miniaturization of light-emitting diodes, conventional wire bonding of the light-emitting diodes and a backplane has not met requirements of micro light-emitting diodes (Micro LEDs). Packaging technologies of general micro light-emitting diodes are achieved with a mass transfer process, but flatness of the backplane and consistency of metal lines are suffered severe requirements during the mass transfer process. Therefore, the micro light-emitting diodes do not be equipped with excellent mass transfer quality. When the electrodes of the backplane are uneven, deviated and/or sunken, it is hard for electrodes of the micro light-emitting diodes to precisely contact electrodes of the backplane, thereby causing the light-emitting diodes and the backplane without excellent electrical connection, and further lowering qualities of the micro light-emitting diode display panel.

In view of this, there is an urgent need to provide a micro light-emitting diode display panel and a method for producing the same for improving electrical connecting defects of the micro light-emitting diode display panel during the mass transfer process.

SUMMARY

Therefore, one aspect of the present disclosure is providing a method for producing a micro light-emitting diode display panel. In the method, an adhesive bonding layer is formed from a mixed adhesive agent, and metallic bridge connection structures are formed, thereby enhancing electrical connecting properties between light-emitting diodes and a backplane, therefore solving connecting defects induced by conventional electrode defects.

Another aspect of the present disclosure is providing a micro light-emitting diode display panel. In the micro light-emitting diode display panel, a light-emitting diode display panel electrically connects a backplane with an adhesive bonding layer including a plurality of electrode bonding structures and metallic bridge connection structures, and the metallic bridge connection structures which cover the electrode bonding structures can improve the electrical connection between the light-emitting diodes and the backplane, such that the convention connecting defects are solved. Besides, a resin material of the adhesive bonding layer can further enhance tensile strength of the display panel, thereby meeting the requirements of flexible panels.

According to the aforementioned aspect of the present invention, a method for producing a micro light-emitting diode display panel is provided. A backplane is firstly provided, and light-emitting diodes are provided. A plurality of first bonding pads are disposed on a surface of the backplane, and each of the light-emitting diodes includes at least one second bonding pads. Then, the light-emitting diodes transferred to the backplane, thereby causing each of the first bonding pads to correspondently bond the second bonding pad. Next, an adhesive bonding layer is coated on the backplane, and the adhesive bonding layer comprises a resin material and a plurality of conducting particles. And then, the adhesive bonding layer is heated to cause the conducting particles, each first bonding pad and corresponding second bonding pad to jointly construct a bonding structure.

According to some embodiments of the present invention, a eutectic layer is formed between each of the first bonding pads and each of the corresponding second bonding pads.

According to some embodiments of the present invention, the conducting particles have a particle size in a range from 2 μm to 10 μm.

According to some embodiments of the present invention, a ratio of the particle size and a pitch of the light-emitting diode is larger than or equal to 1:5.

According to some embodiments of the present invention, a concentration of the conducting particles is 20 wt % to 50 wt %.

According to some embodiments of the present invention, the temperature of the heating is lower than a eutectic temperature of the bonding structure.

According to some embodiments of the present invention, a height of a top surface of the adhesive bonding layer is higher than a top surface of each of the second bonding pads.

According to some embodiments of the present invention, the method can selectively disposing a packaging layer on the adhesive bonding layer, and packaging the light-emitting diode.

According to some embodiments of the present invention, after the adhesive bonding layer is formed, the conducting particles become metallic bridge connection structures, and the metallic bridge connection structures connect each of the first bonding pads and the corresponding second bonding pad.

According to some embodiments of the present invention, after heating the adhesive bonding layer, the conducting particles become metallic bridge connection structures, and fill in chinks of the eutectic layer.

According to some embodiments of the present invention, after heating the adhesive bonding layer, the metallic bridge connection structures fills in chinks of each of the first bonding pads and each of the corresponding second bonding pads, and the metallic bridge connection structures cover each of the first bonding pads and the corresponding second bonding pad.

According to some embodiments of the present invention, a plurality of dummy contact are selectively formed on the backplane, each of the first bonding pads is adjacent and disposed between two of the dummy contacts, and each dummy contact is made from magnetic materials.

According to some embodiments of the present invention, the operation of heating the adhesive bonding layer can further comprise providing a first heating temperature, and applying an electric field to the light-emitting diode, thereby causing the conducting particles to move toward the dummy contacts; and the operation of heating the adhesive bonding layer can providing a second heating temperature, thereby forming a bonding structure jointly constructed from conducting particles, each of the first bonding pads, adjacent dummy contacts and the corresponding second bonding pad. The first heating temperature is lower than the second heating temperature.

According to the aforementioned aspect of the present invention, a micro light-emitting diode display panel is provided. The micro light-emitting diode display panel comprises a backplane, a plurality of light-emitting diodes and a bonding layer. The light-emitting diode is disposed on the backplane, and the bonding layer is disposed between the backplane and the light-emitting diodes. The bonding layer comprises a plurality of bonding structures, and each of the light-emitting diodes bonds to the backplane through the corresponding bonding structure.

According to some embodiments of the present invention, each of the bonding structures includes a eutectic layer and metallic bridge connection structures.

According to some embodiments of the present invention, the metallic bridge connection structures are formed from a plurality of conducting particles.

According to some embodiments of the present invention, a ratio of the particle size of the conducting particles and a pitch of the light-emitting diode is larger than or equal to 1:5.

According to some embodiments of the present invention, the conducting particles have a particle size in a range from 2 μm to 10 μm.

According to some embodiments of the present invention, the bonding layer further comprises a resin material, and a weight ratio of the conducting particles and the resin material is 1:1 to 1:4.

According to some embodiments of the present invention, the metallic bridge connection structures fill in chinks of the eutectic layer.

According to some embodiments of the present invention, the eutectic layer is constructed from the first bonding pad of the backplane and the corresponding second bonding pad of the light-emitting diode. The metallic bridge connection structures fill in chinks of the first bonding pad and the second bonding pad, and the metallic bridge connection structures cover the first bonding pad and the second bonding pad.

According to some embodiments of the present invention, a melting point of the eutectic layer is higher than a melting point of the metallic bridge connection structures.

According to some embodiments of the present invention, the light-emitting diodes become a plurality of pixel areas, and each of the pixel areas is covered by a packaging layer, thereby forming an islanded structure. There is a gap between the islanded structures.

In the micro light-emitting diode display panel and the method for producing the same, the adhesive bonding layer comprising metallic bridge connection structures is formed between the light-emitting diode display layer and the backplane to improve the electrical connecting therebetween, thereby solving conventional electrode defects of the mass transfer process. The resin material of the adhesive bonding layer can enhance tensile strength of the micro light-emitting diode display panel to meet requirements of flexible panels.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
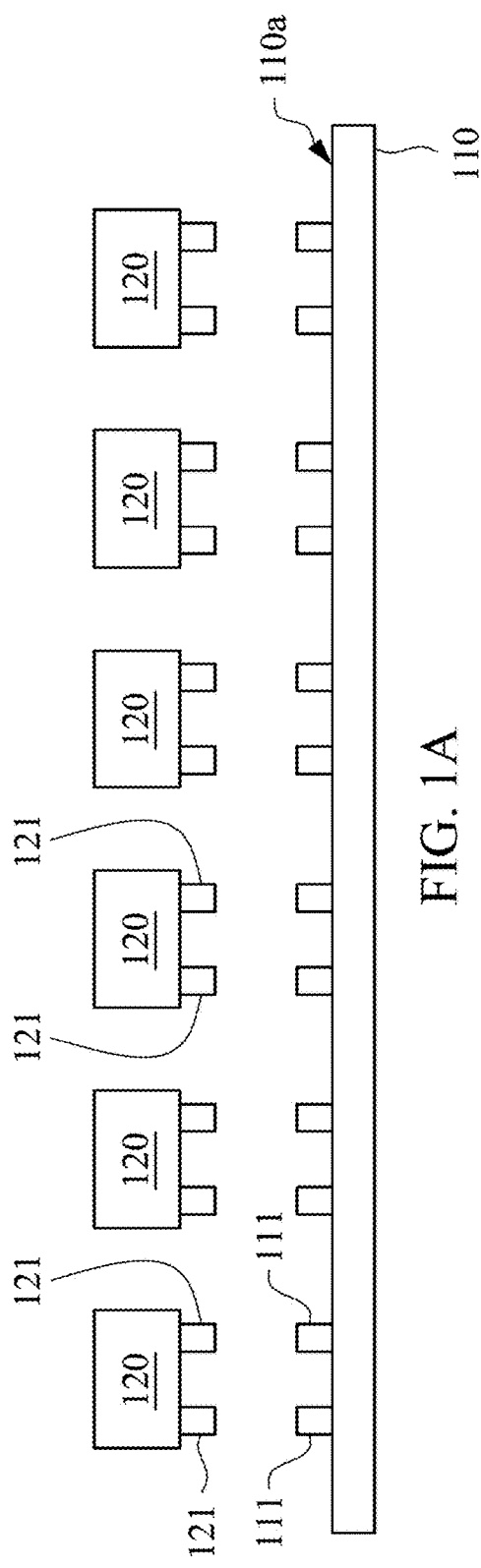
FIG. 1A to FIG. 1D respectively illustrates a micro light-emitting diode display panel according to a processing procedure of some embodiments of the present invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1A. FIG. 1A illustrates a side surface of a micro light-emitting diode display panel according to a processing procedure of some embodiments of the present invention. The micro light-emitting diode display panel includes a backplane 110 and a plurality of light-emitting diodes 120. A plurality of first bonding pads 111 are disposed on a surface 110a of the backplane 110. In some embodiments, the bonding pads 111 are formed from conducting materials. In some examples, the conducting materials can include metallic materials and/or metallic alloy materials. It can be realized that the surface 110a of the backplane 110 can include Thin Film Transistor (TFT), Micro ICs, other suitable semiconductor structure, other suitable electric circuit, or a combination thereof. Those structures are well known by one skilled in the art rather than focusing or mentioning them in details. In some examples, the backplane 110 can be a backplane with flexibility and/or stretchability. For example, the backplane 110 can include a printed circuit board (PCB), a glass backplane, a silicone backplane, a polymeric backplane (e.g. polyimide (PI)), other backplanes formed from suitable materials, or a combination thereof.

Each of the light-emitting diodes 120 can include at least one second bonding pads 121. The light-emitting diodes 120 can be sub pixels such as blue light-emitting diodes, green light-emitting diodes and red light-emitting diodes, and a pixel is composed of three sub pixels (a blue light-emitting diode, a green light-emitting diode and a red light-emitting diode). Similarly, the second bonding pads 121 are formed from conducting materials (e.g. metallic materials and/or metallic alloy materials). In some embodiments, conducting materials of the first bonding pads 111 are different from those of the second bonding pads 121.

During producing the micro light-emitting diode display panel, the light-emitting diodes 120 and the backplane 110 are bonded by a mass transfer process. It is necessary for the second bonding pads of the light-emitting diodes 120 to align with the first bonding pads of the light-emitting diodes 120, and the bonding pads 121 and the bonding pads 111 are bonded in a one-to-one manner to form electrode contacts. As shown in FIG. 1A, although each light-emitting diodes 120 is independent, it can be realized that the light-emitting diodes 120 are temporarily fixed on a carrier (not illustrates) with an extreme bonding strength during a mass transfer process. Therefore, in a precision routing, the second bonding pads 121 of other light-emitting diodes 120 will align with the corresponding first bonding pads 111 when the second bonding pad 121 in one of the light-emitting diodes 120 aligns with the corresponding first bonding pad 111.

Figure 1B:
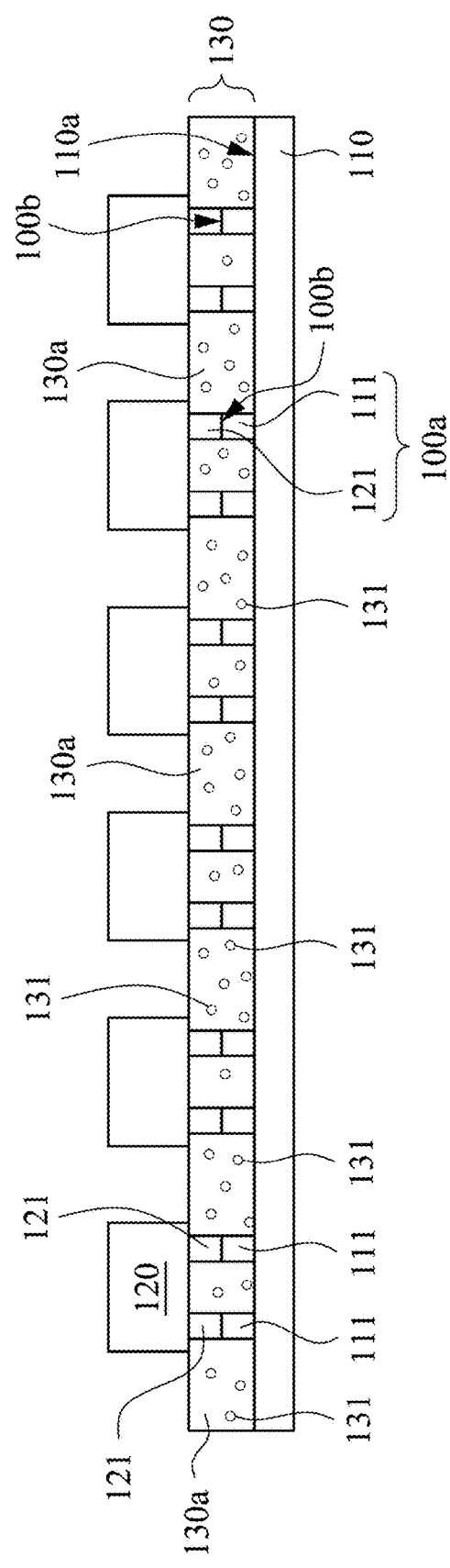

Referring to FIG. 1A and FIG. 1B simultaneously. FIG. 1B illustrates a micro light-emitting diode display panel according to a processing procedure of some embodiments of the present invention. After the electrode contacts are formed, the electrode contacts with physical contacting is further heated to eutectic temperature, thereby forming eutectic structures 100a consisted of the first bonding pad 111 and the corresponding second bonding pad 121. When the electrode contacts are heated to the eutectic temperature, the conducting materials of the first bonding pad 111 and the second bonding pad 121 can become a eutectic layer 100b between the bonding pads 111 and 121 with a manner of eutectic bonding. Therefore, the light-emitting diode 120 can electrically connect to the backplane 110 through the second bonding pad 121, the eutectic layer 100b and the first bonding pad 111 of the eutectic structures 100a in sequence. In some embodiments, the first bonding pad 111 and the second bonding pad 121 can pre-heated to a temperature lower than the eutectic temperature during the procedure of the aforementioned operation of aligning electrodes, thereby shortening periods for heating to the eutectic temperature after forming the electrode contacts. Based on the conducting materials of the first bonding pad 111 and the second bonding pad 121, the eutectic layer 100b of the eutectic structures 100a can have corresponding eutectic compositions. In some embodiments, there are no limitations for compositions of the eutectic structures 100a of the present invention, and it is merely necessary for the compositions of the eutectic structures 100a to cause the light-emitting diode 120 and the backplane 110 to form the bonding of the eutectic layer 100b. For example, the eutectic layer 100b of the eutectic structures 100a can be AuSn, TiAu, PnSn, SnCu, AnSnIn, AuGe, AuSi, SnIn, SnAg, SnBi, other suitable eutectic compositions, or a combination thereof.

After forming the eutectic structures 100a, an adhesive bonding layer 130 is formed on a surface 110a of the backplane 110. The adhesive bonding layer 130 is fabricated by a mixed adhesive agent. The mixed adhesive agent can comprise a resin material 130a and conducting materials 131. In some embodiments, the forming of the adhesive bonding layer 130 can achieved by a dispenser, other suitable device or means, or a combination thereof. For example, the mixed adhesive agent can be dropped to the surface 110a of the backplane 110 between two pixels when the adhesive bonding layer 130 is formed. It can be realized that it is merely an example, and it is not used for limiting the method for forming the adhesive bonding layer 130 of the present invention. In some examples, for enhancing coating and film forming abilities of the mixed adhesive agent, a viscosity of the mixed adhesive agent can be 1 Pa/s to 5 Pa/s. In some examples, the resin material 130a can be epoxy, other suitable resin materials, or a combination thereof. In the mixed adhesive agent, the conducting materials 131 are dispersed uniformly in the resin material 130a. In some embodiments, based on the mixed adhesive agent as 100 wt %, a concentration of the conducting materials 131 can be 20 wt % to 50 wt %. In some embodiments, the conducting materials 131 can be conducting particles, conducting materials with other shapes, or a combination thereof. In some examples, a particle size of the conducting particles can be 2 μm to 10 μm. For example, the conducting materials 131 can include but be not limited to gold, silver, copper, aluminum, molybdenum, titanium, bismuth tin alloy, other suitable metallic materials or alloy materials, or a combination thereof.

In some embodiments, the mixed adhesive agent can selectively include a dispersing agent. The dispersing agent can further improve dispersed uniformity of the conducting materials 131 in the mixed adhesive agent. For enhancing dispersibility of the conducting materials 131 in the organic resin material 130a, the dispersing agent can be surfactant, and/or other additive agent which can improve dispersibility of the conducting materials 131. In some examples, the dispersing agent can include but be not limited to cetyltrimethylammonium bromide (CTAB), polyvinyl pyrrolidone (PVP), dodecyl mercaptan, other suitable surfactant, or a combination thereof.

In some embodiments, the mixed adhesive agent can selectively include other additive agent (e.g. flux) to improve conducting properties of the conducting materials 131. When the mixed adhesive agent includes the flux, it can improve bonding properties between the first bonding pad 111 and the second bonding pad 121.

Figure 1C:
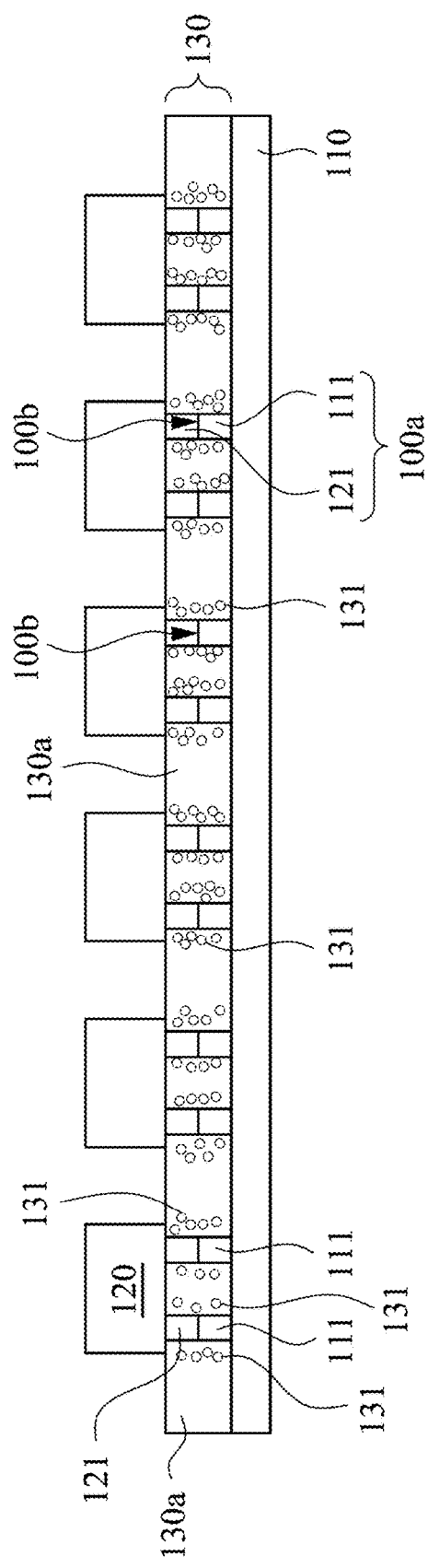
Figure 1D:
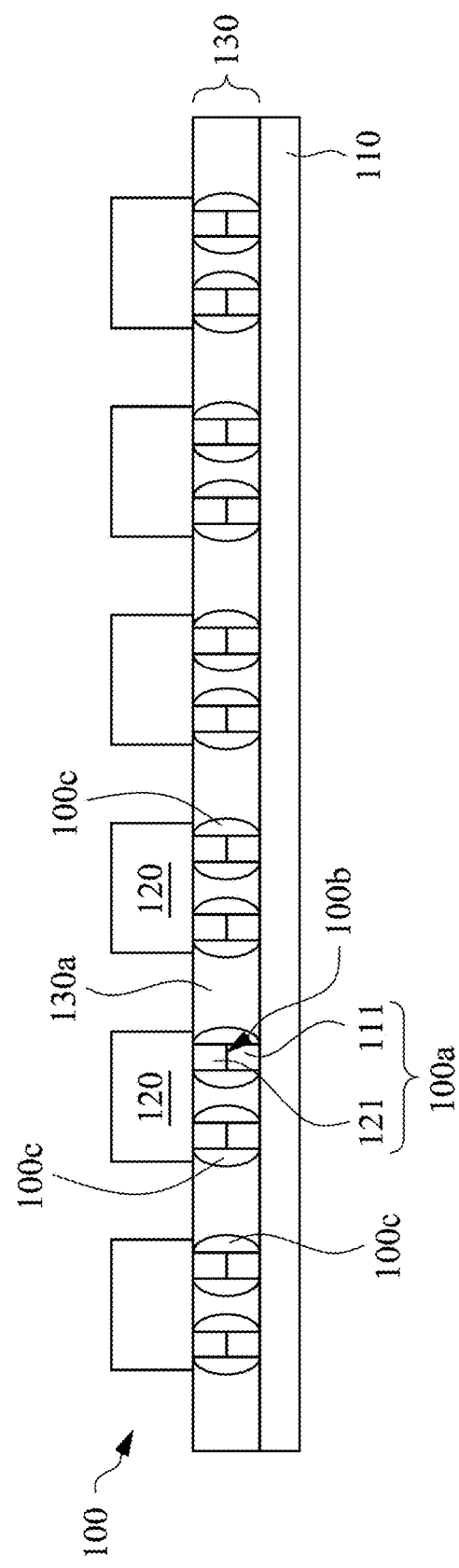

Referring to FIG. 1C and FIG. 1D simultaneously. FIG. 1C and FIG. 1D respectively illustrates a micro light-emitting diode display panel according to a processing procedure of some embodiments of the present invention. After forming the adhesive bonding layer 130, the adhesive bonding layer 130 is further heated to a temperature not lower than melting temperature of the conducting materials 131. When the conducting materials 131 are melted, the molten conducting materials 131 are aggregated due to an attraction of surface energy, and the molten and aggregated conducting materials 131 move toward to the eutectic structures 100a with eutectic bondings, and further forming metallic bridge connection structures 100c after cooling, so as to form a bonding structure including the eutectic structures 100a and the metallic bridge connection structures 100c. Therefore, the micro light-emitting diode display panel 100 of the present invention is fabricated. Because the conducting materials 131 are uniformly blended in the mixed adhesive agent, each of the eutectic structures 100a can be covered by at least one metallic bridge connection structures 100c. However, it can be realized that each bonding structure is not directly electrically conductive to adjacent bonding structure.

In some embodiments, when the conducting materials 131 are molten, the conducting materials 131 which move due to the difference of surface energy can permeate into chinks of the materials of the eutectic layer 100b of the eutectic structures 100a, further enhancing conducting properties of the eutectic structures 100a. In other embodiments, the molten conducting materials 131 can permeate into chinks of materials in the first bonding pad 111 and/or the second bonding pad 121, and the eutectic structures 100a can be covered by the metallic bridge connection structures 100c formed from the molten conducting materials 131, such that the conducting properties of the eutectic structures 100a can be further improved.

In some embodiments, a ratio of particles sizes of the conducting materials 131 and a pitch of the light-emitting diode 120 can be larger than or equal to 1:5 (e.g. 1:6, 1:7, 1:8, 1:9, or the like). The term "pitch" means the shortest distance between the first bonding pads 121 of two adjacent light-emitting diodes 120. When the ratio of particles sizes of the conducting materials 131 and a pitch of the light-emitting diode 120 are the aforementioned range, the metallic bridge connection structures 100c are hard to electrically conduct to each other. Besides, when particles sizes of the conducting materials 131 are 2 μm to 5 μm, a concentration of the conducting materials 131 in the mixed adhesive agent preferably is 20 wt % to 50 wt %, thereby efficiently preventing the conducting materials 131 from aggregation resulted from the intense increasing of the surface energy, and further preventing metallic bridge connection structures 100c from electrically conducting to each other.

When the mixed adhesive agent includes the dispersing agent, a concentration of the conducting materials 131 in the mixed adhesive agent is 20 wt % to 50 wt %, and/or particle sizes of the conducting materials 131 are 2 μm to 5 μm, the metallic bridge connection structures 100c formed from the conducting materials 131 are hard to short-circuit, such that they can ensure that the eutectic structures 100a are electrically insulated.

In order to efficiently aggregate the molten conducting materials 131 and further to form the metallic bridge connection structures 100c, a top surface of the adhesive bonding layer 130 is not lower than the eutectic structures 100a. In other words, the adhesive bonding layer 130 can completely cover the eutectic structures 100a. More preferably, a height of the top surface of the adhesive bonding layer 130 is accordant with a joint surface of the light-emitting diode 120 and the eutectic structures 100a. Accordingly, the metallic bridge connection structures 100c can be completely covered by the resin material 130a, rather than being exposed.

When the conducting materials 131 are heated to melting temperature, a portion of the resin material 130a can also be subjected to a crosslinking reaction. However, it can be realized that the crosslinking reaction of the resin material 130a does not influence the aggregation of the molten conducting materials 131 because curing temperature of the resin material 130a is higher than aggregating temperature of the conducting materials 131.

Figure 1E:
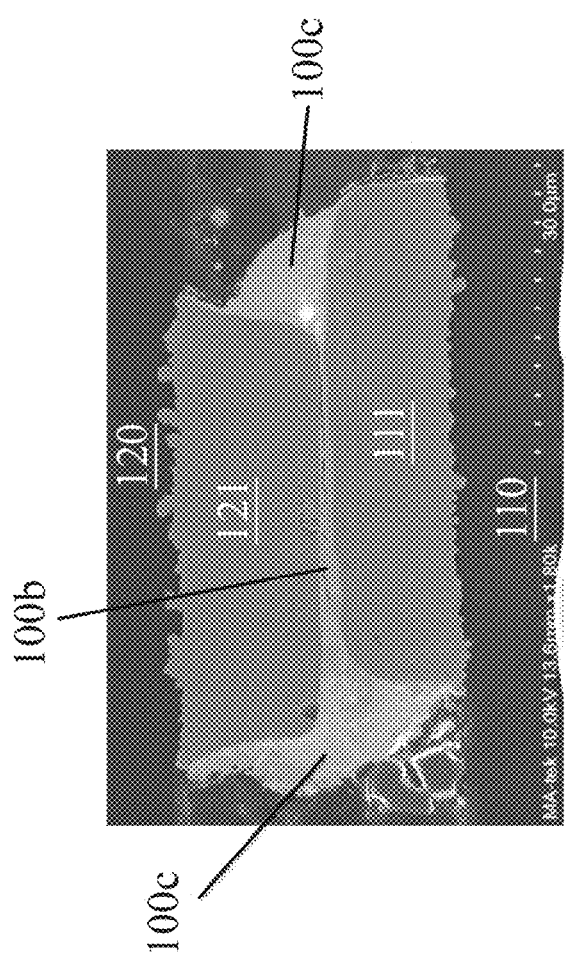
FIG. 1E shows a transmission electron microscope image of a eutectic structure and metallic bridge connection structures of a micro light-emitting diode display panel according to some embodiments of the present invention.
Figure 2C:
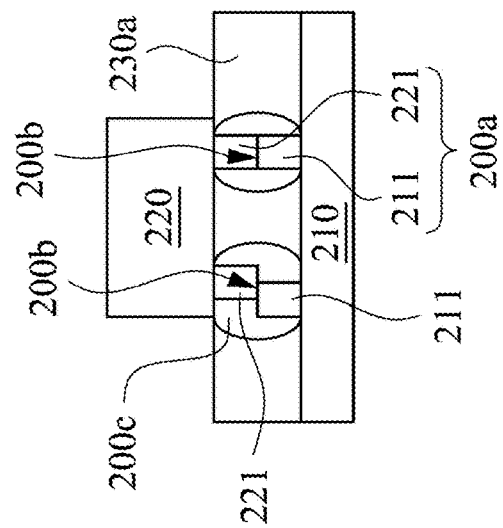
FIG. 2A to FIG. 2C respectively illustrates a side surface of the eutectic structures and the metallic bridge connection structures of a micro light-emitting diode display panel according to some embodiments of the present invention.
Figure 2B:
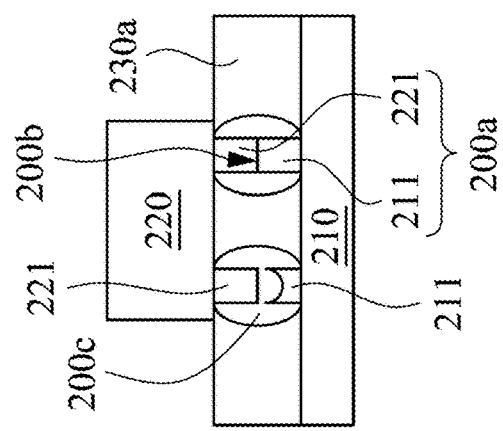
Figure 2A:
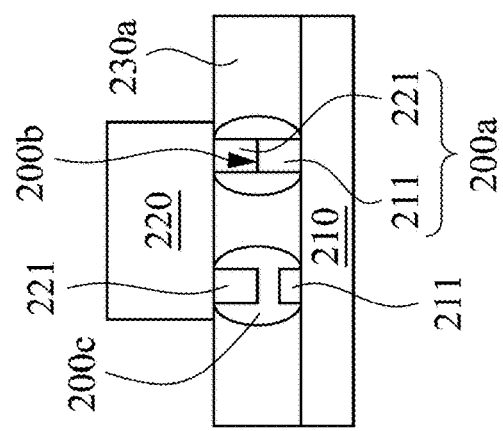

Referring to FIG. 1D and FIG. 1E simultaneously. FIG. 1E shows a transmission electron microscope image of the eutectic structure and the metallic bridge connection structures of a micro light-emitting diode display panel according to some embodiments of the present invention. FIG. 1E clearly shows the eutectic structure 100a formed from the first bonding pad 111 and the second bonding pad 121, and the eutectic layer 100b between the bonding pads 111 and 121. Further, the eutectic structures 100a is covered by the metallic bridge connection structures 100c, thereby electrically conducting to the first bonding pad 111 and the second bonding pad 121. The crosslinked resin material covers the metallic bridge connection structures 100c, so as to protect the metallic bridge connection structures 100c. Therefore, each of the light-emitting diodes 120 in the micro light-emitting diode display panel 100 of the present invention can efficiently electrically connect to the backplane 100 through the bonding structure, thereby preventing form connecting defects during the mass transfer process of the micro light-emitting diode. As shown in FIG. 2A to FIG. 2C, the connecting defects resulted from uneven electrodes (FIG. 2A), sunken electrodes (FIG. 2B) and deviated electrodes (FIG. 2C) can be solved by reinforcing electrical connection between the first bonding pad 211 and the second bonding pad 221 with the metallic bridge connection structures 200c. Besides, the resin material 230a in the adhesive bonding layer can efficiently enhance tensile strength of the panel, thereby suitable being applied to fabricate flexible panel and preventing broken risks while bending the panel. It is noted that although the left deviated electrodes (FIG. 2C) can form the eutectic layer 200b, the two bonding pads are not indeed aligned, such that the eutectic layer 200b formed from the deviated electrodes are belonged to connecting defects of mass transfer process.

As the above description, shown as in FIG. 1D, the conducting materials in the micro light-emitting diode display panel 100 of the present invention are drawn by surface energy, thereby causing the molten conducting materials to move to the eutectic structures 100a and aggregate to form metallic bridge connection structures 100c which cover the eutectic structures 100a, and further improving electrical connection between the light-emitting diode and the backplane, so as to solve conventional connecting defects. Besides, it is unnecessary to dispose additional blocking structures to block the molten conducting materials for the micro light-emitting diode display panel 100 of the present invention because the migration of the molten conducting materials are limited to the surface energy. In other words, it is unnecessary to dispose the blocking structures and/or other structures which can influence the migration of the conducting materials to the eutectic structures 100a in the adhesive bonding layer 130 between two adjacent light-emitting diodes 120. Therefore, the micro light-emitting diode display panel of the present invention can equip with narrower pitch, and much better resolution and displaying quality.

Figure 3:
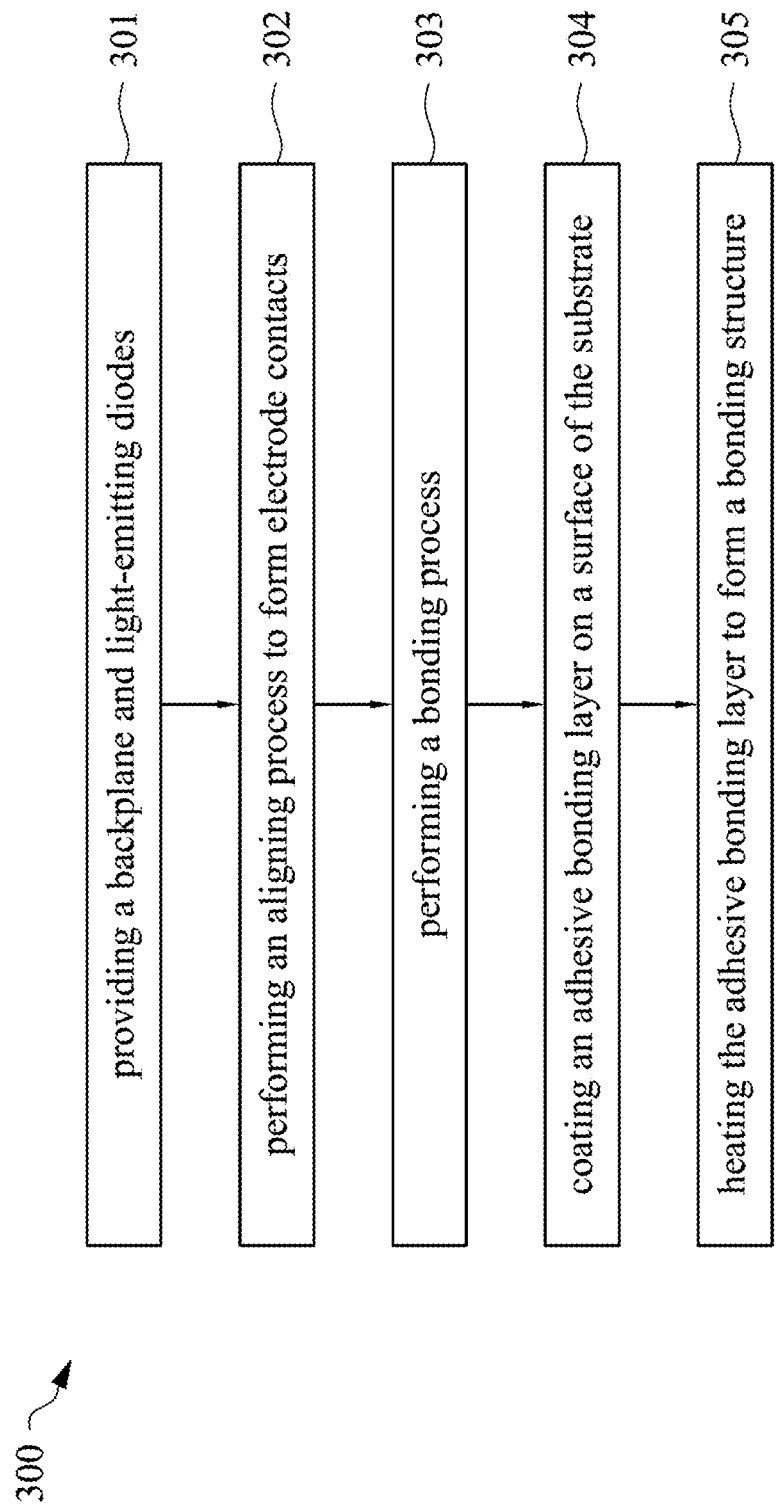
FIG. 3 illustrates a flow chart of a method for producing a micro light-emitting diode display panel according to some embodiments of the present invention.
Figure 4A:
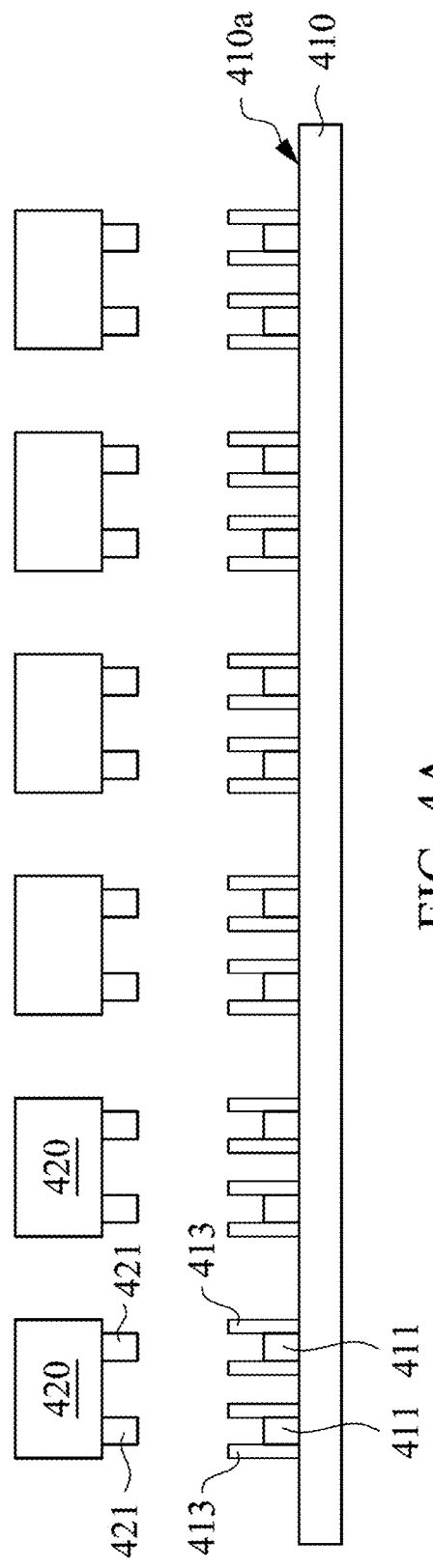
FIG. 4A to FIG. 4D respectively illustrates a side surface of a micro light-emitting diode display panel according to a processing procedure of some embodiments of the present invention.
Figure 4B:
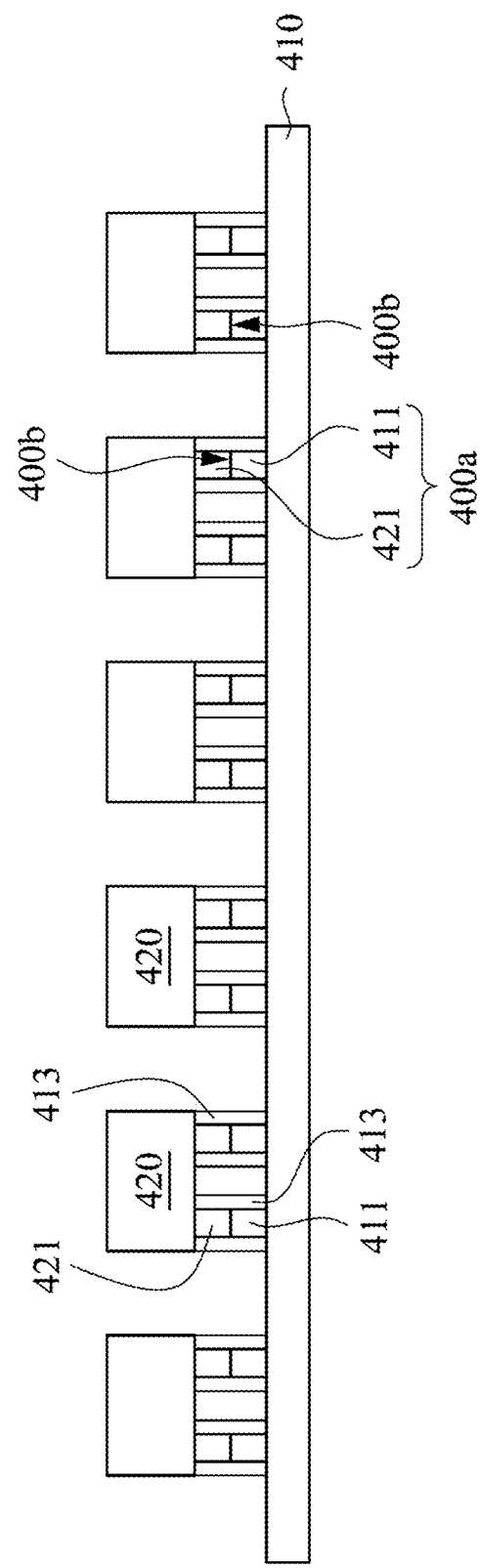
Figure 4C:
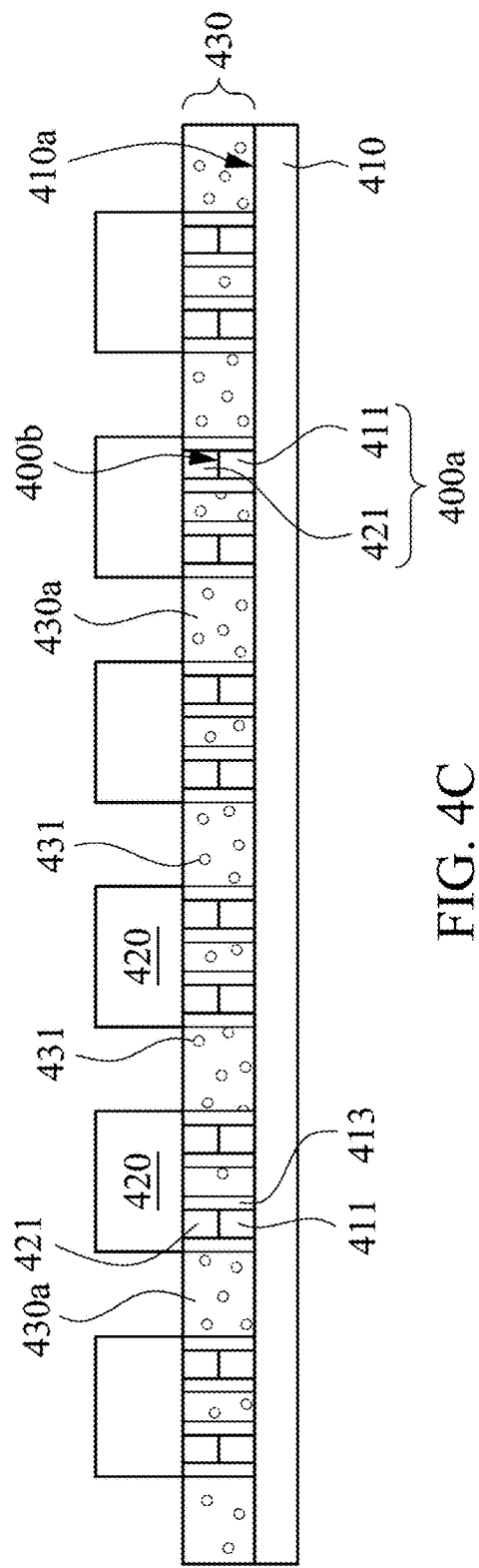
Figure 4D:
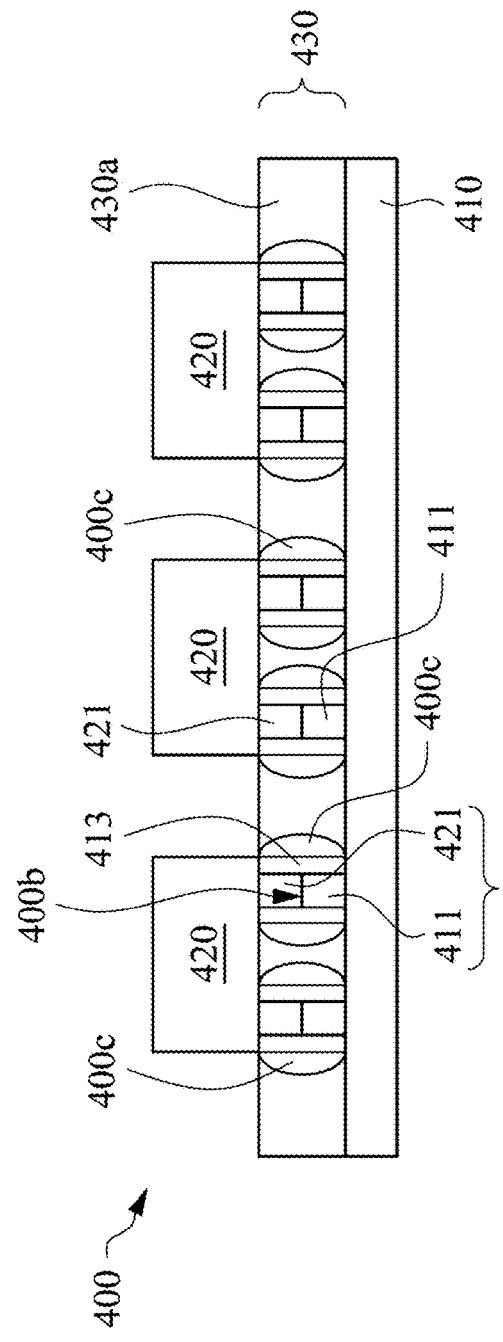

Referring to FIG. 3, FIG. 1A and FIG. 1B simultaneously. FIG. 3 illustrates a flow chart of a method for producing a micro light-emitting diode display panel according to some embodiments of the present invention. The micro light-emitting diode display panel 100 can be fabricated by the method 300. In the method 300, the backplane 100 and the light-emitting diodes 120 are firstly provided, shown as operation 301. The backplane 110 includes a plurality of first bonding pads 111, and each of the light-emitting diodes 120 has at least one second bonding pads 121.

Then, the first bonding pads 111 and the second bonding pads 121 are subjected to an aligning process with an one-to-one manner to form electrode contacts, and further heating to eutectic temperature of the electrode contacts to perform a eutectic process (i.e. bonding process) to form the eutectic structures 100a including the eutectic layer 100b, shown as operation 302 and operation 303. After the operation 303 is performed, there are connecting defects such as uneven electrodes, deviated electrodes and/or sunken electrodes between the first bonding pad 111 and the second bonding pad 121, such that the conducting properties between the light-emitting diode 120 and backplane 110 is lowered.

In order to efficiently solve the aforementioned connecting defects, the adhesive bonding layer 130 is formed on the surface 110a of the backplane 110, shown as operation 304. The adhesive bonding layer 130 is formed from the mixed adhesive agent, and the mixed adhesive agent includes the resin material 130a and the conducting materials 131. The conducting materials 131 preferably can be metallic materials and/or metallic alloy materials, and the melting temperature of the conducting materials 131 is lower than the eutectic temperature of the eutectic layer 100b. For improving the protection of the adhesive bonding layer 130 for the eutectic structures 100a, the top surface of the adhesive bonding layer 130 is not lower than the joint position of the light-emitting diode 120 and the second bonding pad 121, and a height of the top surface of the adhesive bonding layer 130 preferably is accordant with a height of the aforementioned joint position.

Referring to FIG. 3, FIG. 1C and FIG. 1D simultaneously. After forming the adhesive bonding layer 130, the adhesive bonding layer 130 is subjected to a heating process to form the metallic bridge connection structures 100c, shown as operation 305. The heating process is performed to heat to a temperature not lower than the melting temperature of the conducting materials 131. As an increasing of the temperature, the conducting materials 131 can be melted to liquid phase, and the molten conducting materials aggregate and move toward the eutectic structures 100a base on an attractive force of the surface energy, therefore forming the metallic bridge connection structures 100c after cooling. In some embodiments, in order to prevent the applied heat energy from influencing or damaging the eutectic layer 100b formed by eutectic bonding, temperature of the heating process is lower than temperature of the aforementioned eutectic process (i.e. the bonding temperature of forming the eutectic layer). As a lowering of the temperature, the aggregated conducting materials 131 can be cooled to form the metallic bridge connection structures 100c, and the metallic bridge connection structures 100c can cover the eutectic structures 100a to form the bonding structures due to the attraction of the surface energy, such that the conducting between the light-emitting diode 120 and the backplane 110 can be improved. Therefore, the connecting defects of the aforementioned light-emitting diode 120 can be solved. Moreover, a portion of the resin material 130a in the adhesive bonding layer 130 is subjected to a crosslinked reaction during the heating process, thereby enhancing tensile strength of the micro light-emitting diode display panel 100, and further protecting the metallic bridge connection structures 100c. In the above description, the molten conducting materials 131 can permeate into chinks of the eutectic layer 100b, and/or the molten conducting materials 131 can permeate into chinks of the first bonding pads 111 and/or the second bonding pads 121 to further improve the electrical connection between the light-emitting diodes 120 and backplane 110 except the electrical conduction provided by the metallic bridge connection structures 100c.

In the micro light-emitting diode display panel 100 fabricated by the method 300, there are excellent electrically connective properties between the light-emitting diodes 120 and the backplane 110, thereby overcoming the defects of incompletely eutectic bonding, and further solving the connecting defects during the mass transfer process. Besides, the resin material 130a can efficiently protect the metallic bridge connection structures 100c and enhance tensile strength thereof, such that the micro light-emitting diode display panel 100 can be applied in flexible displays.

Referring to FIG. 4A to FIG. 4D. FIG. 4A to FIG. 4D respectively illustrates a side surface of a micro light-emitting diode display panel according to a processing procedure of some embodiments of the present invention. The micro light-emitting diode display panel 400 includes a backplane 410 and a plurality of light-emitting diodes 420. The backplane 410 includes a plurality of first bonding pads 411 and dummy contacts 413, and each of the first bonding pads 411 is disposed between two dummy contacts. There are no limitations to a protruding height of the dummy contacts 413 which protrudes from the backplane 410. In some embodiments, the protruding height of the dummy contacts 413 can higher than a height of the first bonding pads 411, thereby facilitating to align the electrodes during the mass transfer process. The dummy contact 413 can include hard magnetic materials, and/or other suitable magnetic materials. In some examples, the hard magnetic materials can include but be not limited to iron, nickel, aluminum, cobalt, other suitable magnetic materials, or a combination thereof. Each light-emitting diode 420 can include at least one second bonding pad 421. In some embodiments, a height of the dummy contact 413 is accordant with a total height of the first bonding pad 411 and the second bonding pad 421. In other words, the second bonding pad 421 can be contained in a recess constructed from the dummy contacts 413 and the bonding pad 411 during the following aligning process, thereby forming an electrode contact with the first bonding pad. It can be realized that it is not limited to the present invention. In other embodiments, the height of the dummy contact 413 can be lower than the total height of the first bonding pad 411 and the second bonding pad 421. In some embodiments, the first bonding pads 411 and the second bonding pads 421 respectively are made from different metallic material.

Then, the electrode contact is further heated to eutectic temperature of the first bonding pad 411 and the second bonding pad 421, thereby forming a eutectic layer 400b of the eutectic structures 400a bonded with a manner of eutectic bonding. In some embodiments, there are no limitations to compositions of the eutectic layer 400b of the eutectic structures 400a of the present invention, and it is need for the compositions of the eutectic layer 400b of the eutectic structures 400a to cause the light-emitting diode 420 and the backplane 410 to form the eutectic bonding. In some examples, the eutectic layer 400b of the eutectic structures 400a can exemplarily be but be not limited to AuSn, TiAu, PnSn, SnCu, AnSnIn, AuGe, AuSi, SnIn, SnAg, SnBi, other suitable eutectic compositions, or a combination thereof.

After forming the eutectic structures 400a, an adhesive bonding layer 430 is formed on a surface 410a of the backplane 410. The adhesive bonding layer 430 is made from a mixed adhesive agent, and the mixed adhesive agent includes a resin material 430a and conducting materials 431. In some examples, the resin material 430a can be epoxy, and/or other suitable resin materials. The conducting materials 431 are uniformly dispersed in the resin material 430a. In some embodiments, the conducting materials 431 can be metallic material and/or metallic alloy material, and examples thereof can include but be not limited to gold, silver, copper, aluminum, molybdenum, titanium, bismuth tin alloy, and/or other suitable metallic materials or alloy materials. In some embodiments, in order to prevent the excessive aggregation of the conducting materials 431 due to the attraction of the surface energy, based on the mixed adhesive agent as 100 wt %, a concentration of the conducting materials 431 can be 20 wt % to 50 wt %. In some embodiments, the conducting materials 431 can be conducting particles, and/or other conducting materials with other shapes. Particle sizes of the conducting particles can be 2 μm to 10 μm.

In some embodiments, the mixed adhesive agent can selectively include a dispersing agent and/or other additive agents. The dispersing agent can further enhance dispersing of the conducting materials 431 in the mixed adhesive agent, thereby preventing from the aggregation of the conducting materials 431. In some examples, the dispersing agent can include but be not limited to cetyltrimethylammonium bromide, polyvinyl pyrrolidone, dodecyl mercaptan, other suitable surfactant, or a combination thereof. The aforementioned additive agent can exemplarily be flux, thereby enhancing the bonding of the first bonding pad 411 and the second bonding pad 421.

Then, the conducting materials 431 in the adhesive bonding layer 430 are heated, and an electric field (positive and negative voltage) is simultaneously applied on each of the light-emitting diodes 420. As an increasing of the temperature, the conducting materials 431 can be melted, and the molten conducting materials 431 are attracted to move toward positions with lower surface energy (i.e. toward the eutectic structures 400*a*) by the difference of surface energy. With the applied positive voltage and negative voltage, the hard magnetic materials in the dummy contact 413 can be attracted by electrophoresis force, thereby moving toward eutectic structures 400*a* with opposite charge.

Next, the temperature of the adhesive bonding layer 430 is further increased to perform a crosslinking reaction to the resin material 430*a*, thereby curing the resin material 430*a*. Therefore, after cooling, the molten conducting materials 431 can form metallic bridge connection structures 400*c* covered the eutectic structures 400*a*, the hard magnetic materials in the dummy contact 413 can be aggregated and move to the eutectic structures 400*a*, and the cured resin material 430*a* can efficiently protect the eutectic structures 400*a* and the metallic bridge connection structures 400*c*. Therefore, the conducting between the light-emitting diode 420 and the backplane 410 can be efficiently improved, and the conventional connecting defects (e.g. uneven electrodes, deviated electrodes and/or sunken electrodes) can efficiently be solved by the enhancement of the electrical connecting properties resulted from the aggregation of the metallic bridge connection structures 400*c* and the hard magnetic materials.

Figure 5:
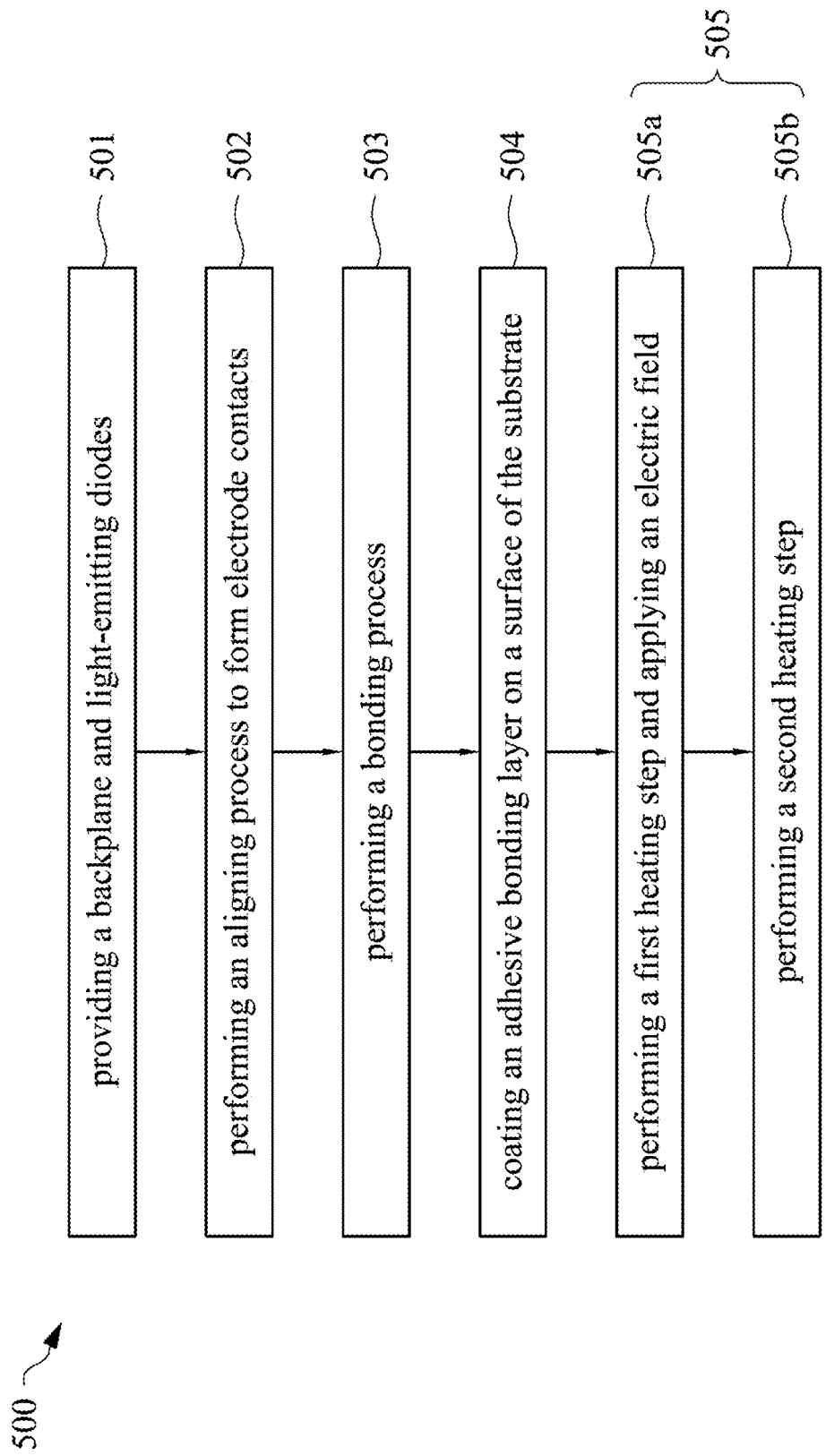
FIG. 5 illustrates a flow chart of a method for producing a micro light-emitting diode display panel according to some embodiments of the present invention.

Referring to FIG. 5 and FIG. 4A to FIG. 4D. FIG. 5 illustrates a flow chart of a method for producing a micro light-emitting diode display panel according to some embodiments of the present invention. The micro light-emitting diode display panel 400 is fabricated by method 500. In the method 500, the backplane 410 and a plurality of light-emitting diodes 420 are provided, shown as operation 501. A plurality of first bonding pads 411 and dummy contacts 413 are disposed on the surface of the backplane, and a height of the dummy contact 413 can be higher than a height of the first bonding pad 411, such that a recess is constructed from the dummy contact 413 and the first bonding pad 411. In other embodiments, the height of the dummy contact 413 can be not higher than the height of the first bonding pad 411. Each of the light-emitting diodes 420 has at least one second bonding pad 421. The first bonding pad 411 and the second bonding pad 421 are made from different material. The dummy contact 413 includes hard magnetic materials, other suitable magnetic materials, or a combination thereof. In some examples, the dummy contact 413 can include iron, nickel, aluminum, cobalt, and/or other suitable magnetic materials.

And then, the first bonding pad 411 and the second bonding pad 421 are subjected to an aligning process with a one-to-one manner, and further subjected to a bonding process to form the eutectic structures 400*a*, shown as operation 502 and operation 503. Because the first bonding pad 411 and two dummy contacts 413 construct the recess, the second bonding pad 421 can efficiently be contained in the recess during the aligning process, thereby facilitating to form the electrode contact. In order to cause the first bonding pad 411 to completely contact the second bonding pad 421, the height of the dummy contact 413 is not higher than a height of the electrode contact (i.e. a combination of the first bonding pad 411 and the second bonding pad 421), such that the dummy contacts 413 do not influence the aligning and contacting of the light-emitting diode 420 and the backplane 410. Preferably, the height of the dummy contact 413 is accordant with the height of the electrode contact. The electrode contact is further heated to eutectic temperature to cause materials of the first bonding pad 411 and materials of the second bonding pad 421 to form eutectic compositions, and further forming the eutectic structures 400*a* including eutectic layer 400*b*. In some examples, based on the difference of the materials of the bonding pads 411 and 421, the eutectic structures 400*a* can include but be not limited to AuSn, TiAu, PnSn, SnCu, AnSnIn, AuGe, AuSi, SnIn, SnAg, SnBi, and/or other suitable eutectic compositions.

After performing operation 503, the adhesive bonding layer 430 is formed on the surface 410*a* of the backplane 410, shown as operation 504. The adhesive bonding layer 430 is made from a mixed adhesive agent, and the mixed adhesive agent can include the resin material 430*a* and conducting materials 431. The resin material 430*a* can exemplarily be epoxy, and/or other suitable resin materials. The conducting materials 431 can include metallic material and/or metallic alloy material. The conducting materials 431 can exemplarily be gold, silver, copper, aluminum, molybdenum, titanium, bismuth tin alloy, other suitable metallic materials or alloy materials, or a combination thereof. The conducting materials 431 can be conducting particles and/or conducting materials with other shapes. In some embodiments, the conducting materials 431 can be conducting particles with particle sizes of 2 μm to 10 μm. In the mixed adhesive agent, the conducting materials 431 are uniformly dispersed in the resin material 430*a*. In some embodiments, based on the mixed adhesive agent as 100 wt %, a concentration of the conducting materials 431 is 20 wt % to 50 wt %. When the concentration of the conducting materials 431 is 20 wt % to 50 wt %, the conducting materials 431 in the mixed adhesive agent can have excellent dispersing properties.

In some embodiments, the mixed adhesive agent can selectively include a dispersing agent and/or other additive agents. The dispersing agent can further improve the dispersing properties of the conducting materials 431 in the mixed adhesive agent. The dispersing agent can exemplarily be cetyltrimethylammonium bromide, polyvinyl pyrrolidone, dodecyl mercaptan, other suitable dispersing agents, or a combination thereof. The other additive agent can exemplarily be flux.

In a heating process 505, a first heating step is firstly performed, and an electric field (positive and negative voltage) is applied on the light-emitting diode 420, shown as operation 505*a*. When the first heating step is performed, the conducting materials 431 are heated to melting temperature to be melted, and the molten conducting materials 431 can move toward the eutectic structures 400*a* with the attraction of surface energy. When the electric field is applied on the light-emitting diode 420, the charge-attraction force induced by the electric field can subject the magnetic material to be moved. In some examples, the first heating step is heated to 130° C. to cause the conducting materials 431 and the magnetic materials in the dummy contact 413 to be moved.

Then, performing a second heating step to cure the resin material 430*a* in the mixed adhesive agent, shown as operation 505*b*. When the second heating step is performed, the resin material 430*a* is heated to curing temperature, so as to subject the resin material 430*a* to a crosslinking reaction. It is noted that temperatures of the first heating step and the second heating step both are lower than eutectic temperature that the first bonding pad 411 and the second bonding pad 421 form the eutectic layer 400b, such that the eutectic layer 400b of the eutectic structures 400a can prevent from damages (such as cleavage) induced by high temperature.

After cooling, the molten conducting materials 431 can become the metallic bridge connection structures 400c which cover the eutectic structures 400a, and the magnetic materials in the dummy contact 413 are fixed after the electric field is removed. Therefore, electrical connecting properties between the light-emitting diodes 420 and the backplane 410 can be efficiently improved by the metallic bridge connection structures 400c and the magnetic materials, and the conventional connecting defects (such as uneven electrodes, deviated electrodes, and/or sunken electrodes) can be prevented. Besides, the cured resin material 430a can enhance structure stability of the adhesive bonding layer 430, thereby causing the micro light-emitting diode display panel 400 to be equipped with excellent tensile strength, such that the micro light-emitting diode display panel 400 can be used to fabricate flexible panel.

Figure 6A:
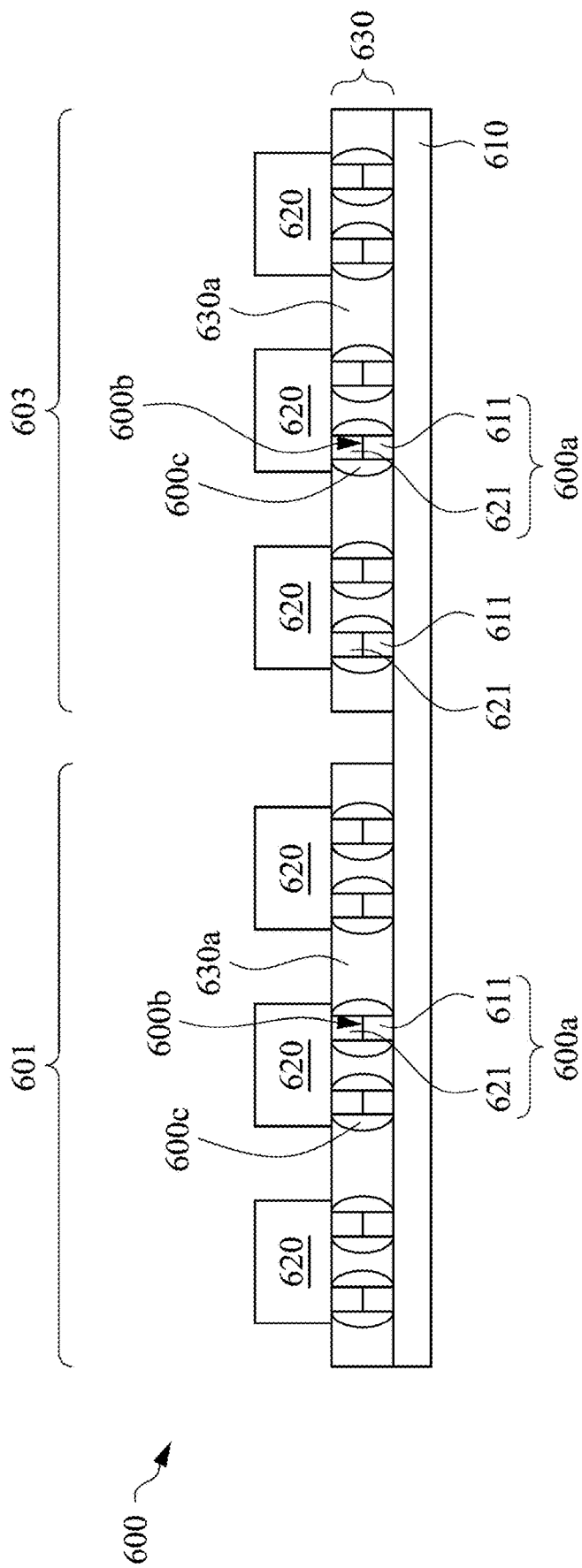
FIG. 6A and FIG. 6B respectively illustrates a side surface of the micro light-emitting diode display panel according to a processing procedure of some embodiments of the present invention.
Figure 6B:
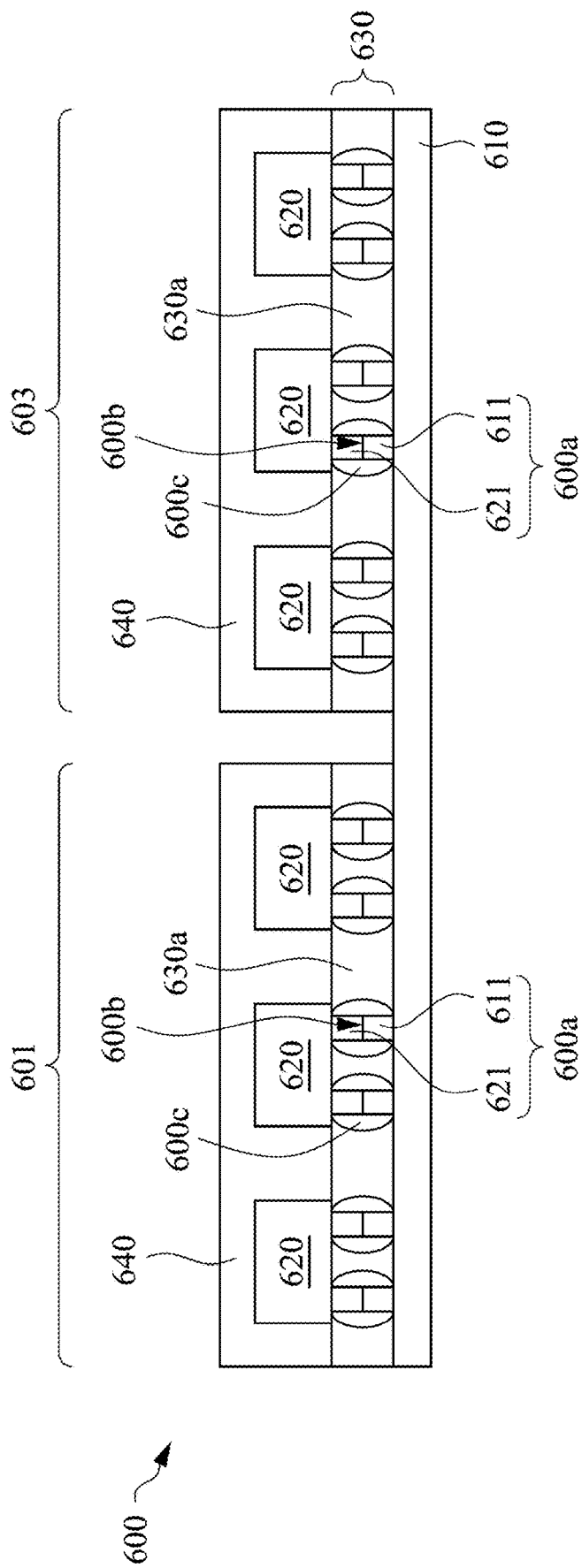

Referring to FIG. 6A and FIG. 6B. FIG. 6A and FIG. 6B respectively illustrates a side surface of the micro light-emitting diode display panel according to a processing procedure of some embodiments of the present invention. The micro light-emitting diode display panel 600 includes a first island portion 601 and a second island portion 603. In a view of overlooking, the first island portion 601 can be a packaging area having 3×3 sub pixels, and the second island portion 603 can be a packaging area having 3×3 sub pixels. It can be realized that the above description is merely exemplary and not to limited the present invention. In some embodiments, the first island portion 601 and the second island portion 603 can have different amounts of sub pixels. In other embodiments, an amount of the sub pixels of the first island portion 601 can be different from that of sub pixels of the second island portion 603.

Shown as FIG. 6A, in each island portion 601 and 603, the adhesive bonding layer 630 is formed from the mixed adhesive agent including the resin material 630a and the conducting materials. Therefore, after the aforementioned heating process is performed, the adhesive bonding layer 630 can include a plurality of eutectic structures 600a and metallic bridge connection structures 600c. With the assisted connection of the metallic bridge connection structures 600c, the electrical connecting properties between the light-emitting diodes 620 and the backplane 610 can further improved, thereby preventing from the conventional connecting defects (such as uneven electrodes, deviated electrodes and/or sunken electrodes). Moreover, the cured resin material 630a can further enhance tensile strength of the island portions 601 and 603, thereby meeting the requirements of the flexible displays. After forming the metallic bridge connection structures 600c, shown as FIG. 6B, a packaging layer 640 which covers the light-emitting diodes 620 and the adhesive bonding layer 630 is respectively formed in each island portions 601 and 603, thereby producing the micro light-emitting diode display panel 600. It can be realized that the adhesive bonding layer 630 and the packaging layer 640 are both independent layered structures in each island portions 601 and 603, rather than continuous layered structures.

As above description, in the micro light-emitting diode display panel of the present invention, the adhesive bonding layer is made from the mixed adhesive agent, and the metallic bridge connection structures which cover the eutectic structures are formed. The metallic bridge connection structures can further improve the electrical connection between the light-emitting diodes and the backplane, thereby preventing from the conventional electrical connecting defects resulted from uneven electrodes, deviated electrodes and/or sunken electrodes. Moreover, the resin material in the mixed adhesive agent can enhance tensile strength of the micro light-emitting diode display panel, such that the micro light-emitting diode display panel of the present invention can be used to fabricate flexible panel.

As is understood by a person skilled in the art, the foregoing preferred embodiments of the present invention are illustrated of the present invention rather than limiting of the present invention. In view of the foregoing, it is intended to cover various modifications and similar arrangements included within the spirit and scope of the appended claims. Therefore, the scope of which should be accorded the broadest interpretation so as to encompass all such modifications and similar structure.

What is claimed is:

1. A micro light-emitting diode display panel, comprising:
 a backplane;
 a plurality of light-emitting diodes, disposed on the backplane; and
 a bonding layer, disposed between the backplane and the light-emitting diodes, wherein the bonding layer includes a plurality of bonding structures, each of the bonding structures includes a eutectic layer and a metallic bridge connection structure, the eutectic layer is formed by directly contacting a first bonding pad of the backplane with a second bonding pad of one of the light emitting diodes corresponding to the first bonding pad, and each of the light-emitting diodes connects to the backplane through one of the bonding structures.

2. The micro light-emitting diode display panel of claim 1, wherein the metallic bridge connection structure is formed from a plurality of conducting particles.

3. The micro light-emitting diode display panel of claim 2, wherein a ratio of a particle size of the conducting particles and a pitch of the light-emitting diodes is larger than or equal to 1:5.

4. The micro light-emitting diode display panel of claim 2, wherein the conducting particles have a particle size range from 2 μm to 10 μm.

5. The micro light-emitting diode display panel of claim 2, wherein the bonding layer further comprises a resin material, and a weight ratio of the conducting particles and the resin material is 1:1 to 1:4.

6. The micro light-emitting diode display panel of claim 1, wherein the metallic bridge connection structure fills in chinks of the eutectic layer.

7. The micro light-emitting diode display panel of claim 1, wherein the metallic bridge connection structure fills chinks between the first bonding pad and the second bonding pad, and the metallic bridge connection structure covers the first bonding pad and the second bonding pad.

8. The micro light-emitting diode display panel of claim 1, wherein a melting point of the eutectic layer is higher than a melting point of the metallic bridge connection structure.

9. The micro light-emitting diode display panel of claim 1, wherein a plurality of pixel areas are formed from the light-emitting diodes, and each of the pixel areas is covered by a packaging layer, thereby forming an island structure, and there is a gap between the islanded structures.

* * * * *